United States Patent [19]

Haubner et al.

[11] Patent Number: 5,070,481
[45] Date of Patent: Dec. 3, 1991

[54] COORDINATED CIRCUIT FOR SUPPLYING POWER FROM A D-C SOURCE TO A MICROCOMPUTER AND ITS SEMICONDUCTOR MEMORIES

[75] Inventors: Georg Haubner, Berg; Hartmut Zöbl, Fürth, both of Fed. Rep. of Germany

[73] Assignee: Robert Bosch GmbH, Stuttgart, Fed. Rep. of Germany

[21] Appl. No.: 893,494

[22] Filed: Aug. 5, 1986

[30] Foreign Application Priority Data

Aug. 17, 1985 [DE] Fed. Rep. of Germany ....... 3529494

[51] Int. Cl.$^5$ .................... H03K 1/14; G06F 13/00
[52] U.S. Cl. .................. 365/228; 307/10.1; 307/442; 364/569; 364/424.04; 365/226; 365/229; 365/227
[58] Field of Search ............... 307/9 R, 110 R, 442; 340/52 R, 52 F, 53, 54, 55, 56; 364/424, 431.04, 431.11, 431.12, 422, 569; 455/307; 365/226, 227, 228, 229

[56] References Cited

U.S. PATENT DOCUMENTS

| 4,031,363 | 6/1977 | Freeman et al. | 364/424 |
| 4,258,421 | 3/1981 | Juhasz et al. | 364/424 |
| 4,541,050 | 9/1985 | Honda et al. | 364/424 |
| 4,551,801 | 11/1985 | Sokol | 364/424 |
| 4,591,782 | 5/1986 | Germer | 324/103 R |
| 4,612,623 | 9/1986 | Bazarnik | 364/424 X |
| 4,613,939 | 9/1986 | Paine | 364/424 |
| 4,617,639 | 10/1986 | Paine | 364/424 X |

FOREIGN PATENT DOCUMENTS

| 0138447 | 8/1982 | Japan | 364/424 |
| 0026390 | 2/1983 | Japan | 365/228 |

OTHER PUBLICATIONS

Justin Orion, "Data Protection for E$^2$PROMs and NVRAMs" Mar. 1984 Intel Corp., Application Note AP-165.

Primary Examiner—William M. Shoop, Jr.
Assistant Examiner—Paul Ip
Attorney, Agent, or Firm—Frishauf, Holtz, Goodman & Woodward

[57] ABSTRACT

A microcomputer (10) in a motor vehicle is supplied with regulated operating voltage through a regulator (12) and a semiconductor (11) for the microcomputer is supplied with voltage from the same vehicle battery, through a voltage divider including a Zener diode, for its chip-select input (CSA) which feeds in through a Schmitt trigger circuit such as to enable writing into the memory (11) when the voltage at that chip-select input lies between upper and lower threshold values. Capacitances connected in parallel to ground where these voltages are respectively connected to the microcomputer and semiconductor memory are so dimensioned that any data statement transfer, begun before the longest delay the microcomputer might have in detecting the voltage drop-off, can be completed in the semiconductor memory before its chip-select input disables any further writing in. In order to keep the stabilizing capacitor (C$_4$) for the operating voltage supply for the memory down to reasonable size, a separate battery can be advantageous for that voltage supply, although this precaution is less necessary when the memory is a EPROM for recording a one-time message from a crash sensor identifying operating conditions at the beginning of a crash.

3 Claims, 2 Drawing Sheets

COORDINATED CIRCUIT FOR SUPPLYING POWER FROM A D-C SOURCE TO A MICROCOMPUTER AND ITS SEMICONDUCTOR MEMORIES

This invention concerns a circuit arrangement for supplying power from a d-c source such as is available on motor vehicles to a microcomputer and semiconductor memories interconnected with the microcomputer for storing and retrieving data. In particular it concerns a circuit that will improve the operation of the microcomputer when there is an inteded or accidental shutdown of power, especially in a system in which, in addition to a microcomputer or microprocessor, there are one or more memories of the CMOS-RAM, NV-RAM or EEPROM kinds or the like.

The semiconductor memories of these various kinds serve to store data words or statements established by the computer, which often require extensive storage facilities, in order to make possible their retrieval when needed. Such computer and memory equipment is utilized in motor vehicles respectively to monitor the functioning of electronically controlled transmissions and ignition systems controlled with reference to characteristic data fields, and the like, and to store the characteristic operating data for diagnosis purposes.

There is a problem with installations of the kind described above when the operating voltage of the microcomputer is shut off intentionally or accidentally, because in the transient shutdown phase of operations undefined data can be transferred from the microcomputer to the semiconductor memories with the result that when the system is switched on again the data statement last written in can occasionally contain serious errors.

It is known in order to reduce the above risk of error to write the data in with one or more repetitions in order then to be able to disregard a last-written data statement that might be incomplete or erroneous. This remedy, however, makes necessary an increase of memory capacity merely for this purpose.

It is further known to cause the microcomputer to generate a particular code, for example after every eight bits, on the basis that the code selected for this purpose can be properly produced only if the microcomputer is then being supplied with an operating voltage of some minimum adequate level, with the further provision that a data statement will be stored in a semiconductor memory only when there are no detectable coding errors. This strategem can lead to the result, however, that in the case of a sudden failure of the operating voltage an important last data statement, although not stored in erroneous form, simply fails to be stored at all.

Another possibility of checking or dealing with this problem is offered when there are continuously changing data sequences which can be checked for the occurrence of "jumps" indicating that a data value which deviates jumpwise must be erroneous. Such a check is not suited, however, for the monitoring of operating systems of motor vehicles where plainly jump-like condition changes can appear.

Memories produced by INTEL of the NV-RAM and EEPROM types are provided with a data protection circuit which blocks any writing in operation if the common operating or supply voltage of the microcomputer and semiconductor memory dips below 4 volts (see INTEL "Application Note" AP-165). This way of handling the problem is also unsuitable for such application situations which require that in case of a shutting off of the supply voltage or a failure resulting from an accident the last data statement should nevertheless be written into the memory in full.

SUMMARY OF THE INVENTION

It is an object of the invention to provide a supply voltage circuit for a computer and memories interconnected therewith that will assure that the semiconductor memory will have written therein the reproduced data statement provided to it in its state immediately preceding a supply voltage failure even in the case of an unforeseen failure such as in the case of an automobile accident, and that this may be assured with the minimum possible memory capacity.

Briefly, the supply circuit for the operating voltage of the microcomputer and the voltage for a chip-select input of a semiconductor memory is so constituted that in the case of a failure or interruption of the voltage source from which these voltages are derived, the relative voltage drop with respect to time of the operating voltage of the microcomputer to the voltage to at least one chip-select input of a semiconductor memory has a time course such that the interval until the earliest possible recognition of the fall of voltage in response to cyclic interrogation by the microcomputer following the initial instant of the voltage fall as a fraction of the interval required for a complete data transfer between microcomputer and semiconductor memory is equal to or smaller than the time interval between the initial instant of voltage fall and the instant when the voltage at the said chip-select input goes below the lower threshold voltage for that input, and that the latter instant occurs earlier than the instant of the operating voltage for the microcomputer goes below the minimum operating voltage required for assuring proper functioning of the microcomputer.

As used herein references to a chip-select input are to be understood in a general sense, as designating an input that permits writing into a semiconductor memory when and only when a (positive) voltage is applied which lies between a defined lower and upper threshold or limit voltages.

By the electrical dimensioning of the circuit provided in accordance with the invention the result is obtained that the writing in of erroneous data into the semiconductor memory during an undefined operating condition of the microcomputer is prevented with absolute reliability and, on the other hand, even in the case of sudden voltage drop resulting from a traffic accident data transfer will remain effective in every case until a complete data sentence has been written into the semiconductor memory.

In the simplest case the desired fall-off behavior as a function of time can be obtained by the provision of correspondingly dimensioned capacitance-resistance networks.

It is advantageous to provide a controller or regulator having at least one capacitance ahead of its input in the supply circuit for the operating voltage of the microcomputer, so that the behavior of the regulator-capacitor arrangement contributes to the fall-off behavior of the microcomputer operating voltage.

With regard to the establishment of the supply voltage for the semiconductor memory, one possibility is to provide a special battery for that purpose, while another possibility is to tap off the supply voltage for the semiconductor memory from the voltage supplied to the microcomputer, with provision of a capacitor of larger capacitance being provided at the tap so that this voltage also would be maintained sufficiently high for a sufficient interval after a failure of the main voltage source.

BRIEF DESCRIPTION OF THE DRAWINGS

The invention is further described by way of illustrative example with reference to the annexed drawings, in which.

DESCRIPTION OF THE ILLUSTRATED EMBODIMENT

Figure 1:
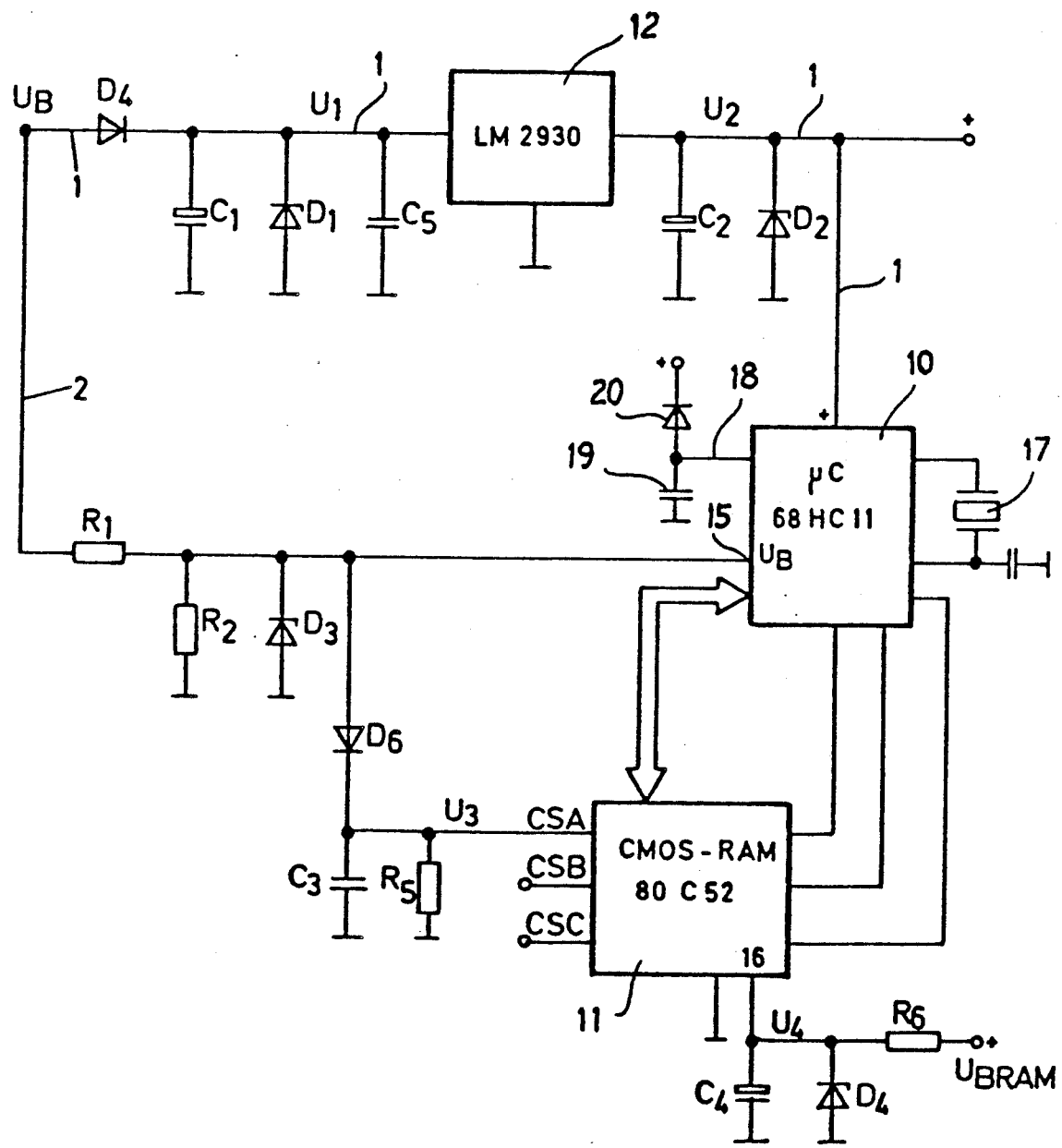
FIG. 1 is a circuit block diagram of a d-c power distribution and voltage supply control for a microcomputer and semiconductor memories in accordance with the invention.

The circuit schematically shown in FIG. 1 comprises a microcomputer 10 and a semiconductor memory 11. In the illustrated case, by way of example, the microcomputer is a type 68HC11 produced by Motorola having a machine cycle time of 1 microsecond, its type designation being marked on the block 10, as well as the abbreviation μC indicating that the block shows a microcomputer.

In the illustrated case the semiconductor memory is of the CMOS-RAM type available under the type designation 80C52. In principle other types of semiconductor memories could be used in its place, such as an EEPROM, an NV-RAM or an EPROM. This last consideration requires attention only when, for example, in connection with a crash sensor a one-time write-in operation of the relevant operating data of a motor vehicle must take place immediately before an accident makes further data processing impossible.

In the case of the provision of the circuit according to the invention in a motor vehicle, the battery voltage $U_B$, which as a rule lies between 11 and 15 volts, serves as the voltage source from which the operating voltage for the microcomputer and for the semiconductor memory is derived. In the voltage supply line 1, which leads from the positive terminal of the vehicle battery, delivering an output positive voltage $U_B$, towards the microcomputer 10, there is first interposed a diode $D_4$ which produces a voltage drop of about 0.6 volt because of its forward conduction voltage threshold. Beyond this diode there are next connected, as FIG. 1 shows a capacitor $C_1$, a Zener diode $D_1$ and a capacitor $C_5$, all connected in parallel between the positive voltage supply line 1 and reference potential (ground or, in the case of a vehicle, chassis potential). The capacitor $C_5$ and the Zener diode $D_1$ serve for eliminating the disturbances produced by voltage peaks, while the capacitor $C_1$ determines the voltage decay behavior for the voltage $U_1$ on the supply line 1 in case the battery voltage is switched off from the line 1. A voltage regulator 12, for example of type designation LM2930, is interposed in the line 1. The regulator 12 assures that so long as its input supply voltage $U_1$ is greater than 5.6 volts, an output voltage $U_2 = 5$ volts will be maintained for the microcomputer 10. On the output side of the regulator 12, between the supply line 1 and ground, another capacitor $C_2$ and another Zener diode $D_2$ are connected in parallel. The latter serves as a safeguard for the regulator against disturbance and smoothes out overswinging of the regulator output voltage in response to fluctuations in the regulator input voltage. The capacitor $C_2$ determines the voltage decay behavior of the regulator output voltage $U_2$ when the battery voltage is switched off. The output voltage of the regulator 12 is, as already mentioned, supplied to the + input of the microcomputer 10.

A voltage supply line 2 leads away from the same battery terminal to which the line 1 is connected ahead of its protective diode $D_4$. The line 2 feeds a network for determining the voltage $U_3$ for a chip-select input CSA of the semiconductor memory 11 and also the unregulated voltage supplied to a terminal 15 of the microcomputer. A voltage divider comprising a series resistance $R_1$ and a shunt resistance $R_2$ is interposed in the voltage supply line 2. The common connection of resistors $R_1$ and $R_2$ goes directly to the terminal 15 of the microcomputer and also has a Zener diode $D_3$ connected in shunt to ground for voltage limiting. The common connection of resistors $R_1$ and $R_2$ is also connected through a diode $D_6$ to the CSA input of the semiconductor memory, with a capacitor $C_3$ and a resistance $R_5$ connected in parallel to ground. The CSA input of the semiconductor memory 11 goes directly to the input of a Schmitt trigger circuit which operates to connect the positive voltage $U_3$ at its input over to its output only after the voltage $U_3$ first exceeds an upper threshold value $U_{3OS}$ and then so long as it remains above a lower threshold value $U_{3US}$. In other words, when the input voltage lies in this range the writing in of data from the microcomputer 10 into the semiconductor memory 11 is enabled. A supply voltage $U_4$ is provided for the semiconductor memory 11, which supply voltage is obtained in the illustrated case from a separate battery not shown in the drawing, the positive terminal of which is identified as $U_{BRAM}$, which is connected to the appropriate input of the semiconductor memory 11 through a series resistance $R_6$ while a Zener diode $D_4$ and a capacitor $C_4$ are connected in parallel with that input of the semiconductor memory 11 for voltage stabilization.

As an alternative, it would also be possible to obtain the supply voltage for the semiconductor memory 11 by branching off the line 1 and processing it in the same manner as the operating voltage for the microcomputer 10 is processed by the regulator 12, but in this case the capacitor $C_4$ would have to be of such great electrical dimensions as to assure that in every case of failure or cut-off of the battery voltage $U_B$ the supply voltage $U_4$ applied to the input 16 of the semiconductor memory 11 would be maintained at a necessary level until the input voltage at the CSA input of the semiconductor memory 11 dips below its lower threshold value $U_{3SU}$. That might be practical if the memory 11 were an EEPROM, perhaps destined to serve for a one-time write-in from a crash sensor.

When the ignition key of a vehicle is turned to cut off the ignition or when the battery voltage $U_B$ fails because of a road accident, at first the voltage $U_2$ is maintained constant at 5 volts by the regulator 12 until at the instant $T_1$ the input voltage to the regulator drops below 5.6 volts (compare the course of the voltage $U_2$ plotted in FIG. 2c). The decay of the voltage $U_1$ at the input of the regulator following the instant of switching off the battery voltage $U_B$ is determined essentially by the capacitance of the capacitor $C_1$ and the internal resistance of the microcomputer 10 (compare FIG. 2b).

The further decay of the voltage $U_2$ at the output of the regulator and at the + input of the microcomputer is determined by the capacitance of the capacitor $C_2$ and the internal resistance of the microcomputer 10 which draws, for example, a current of 50 mA at 5 volts. The decay of the voltage $U_2$ is illustrated in FIG. 2c. At an instant $T_2$ this voltage dips below the minimum operating voltage $U_{2min}$ of the microcomputer 10.

The decay of the voltage $U_3$ after switching off the battery voltage $U_B$ is determined by the capacitor $C_3$ and the parallel connected resistance $R_5$, because the input resistance of the Schmitt trigger circuit connected to the CSA input of the semiconductor memory 11 has a very high ohmic value.

Illustrative values of the principal components are 47 $\mu$F for the capacitor $C_1$, 220 $\mu$F for the capacitor $C_2$, 22 nF for the capacitor $C_3$, 47 $\mu$F for the capacitor $C_4$, 11,000 ohms for the resistance $R_5$, for a current drain of 50 mA at 5 volts and a machine cycle time of 1 $\mu$s in the microcomputer.

Figure 2A:
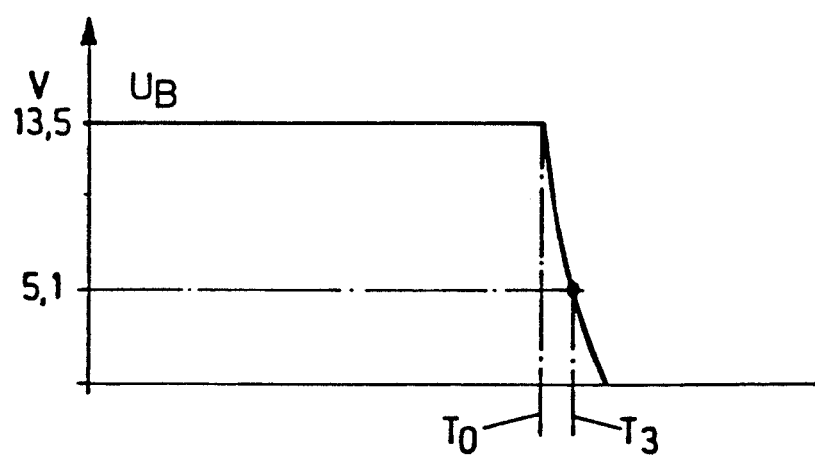
FIGS. 2a, 2b, 2c and 2d are graphs plotting the course of fall-off of the respective voltage $U_B$, $U_1$, $U_2$ and $U_3$ designated on the diagram of FIG. 1, plotted against a common time scale.
Figure 2B:
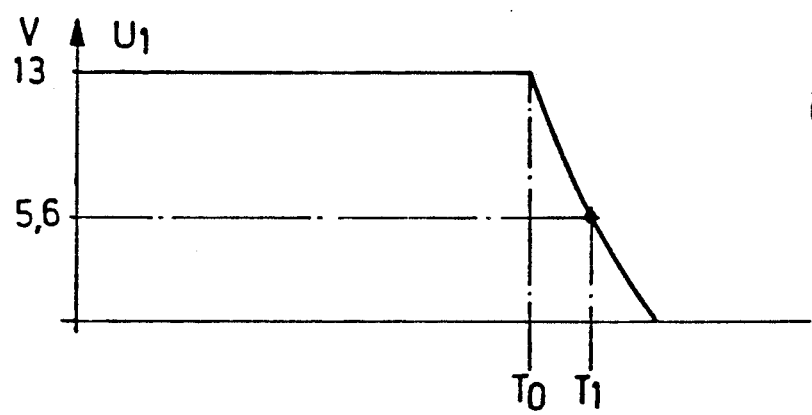
Figure 2C:
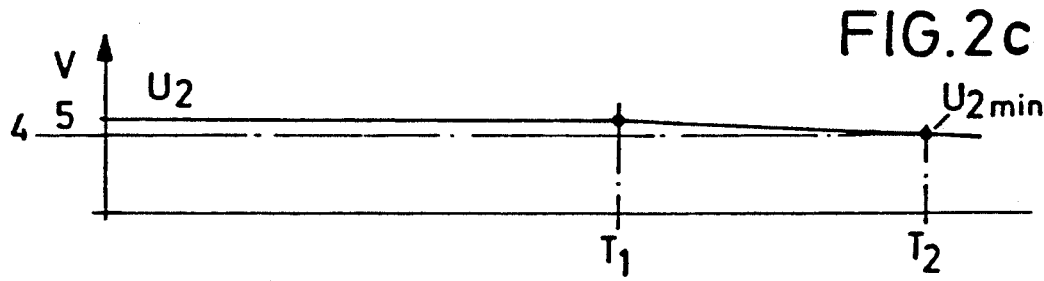

On the basis of the above-described circuit and illustrative electrical values of components and the decay behavior of the relevant voltages $U_2$ and $U_3$ thereby obtained, the following takes place:

When the battery voltage $U_B$ is shut off or is interrupted by an accident at an instant $T_0$ the voltage $U_B$ at the input of the line 1, as shown in FIG. 2a (not to scale) decays. The microcomputer 10 can recognize at the earliest that a voltage drop has taken place only after an instant $T_3$ following the instant $T_0$ because of its cycle for interrogating the battery voltage $U_B$, for example every 20 microseconds. This can happen, for example, when $U_B$ goes below 5.1 V as illustrated in FIG. 2a. From this instant $T_3$ on, no more data will be transferred to the semiconductor memory 11 by the microcomputer 10 because of the recognition of the voltage drop. It is possible, however, that in the interval between $T_0$ and $T_3$ a voltage interrogation immediately followed by the beginning of transmission of a data statement took place. The time necessary for transmission of a complete data statement is $\Delta T$. According to the invention, the result is now obtained that it is assured that proper operating conditions will still be maintained during this time interval.

When after the instant $T_0$ the voltage at the input of the regulator 12 dips below the value of 5.6 volts at the instant $T_1$ (compare FIG. 2b), the voltage $U_2$ for operation of the microcomputer 10 also drops until at an instant $T_2$ the minimum operating voltage $U_{2min}$, in the illustrated case 4 volts, is reached (compare FIG. 2c).

Figure 2D:
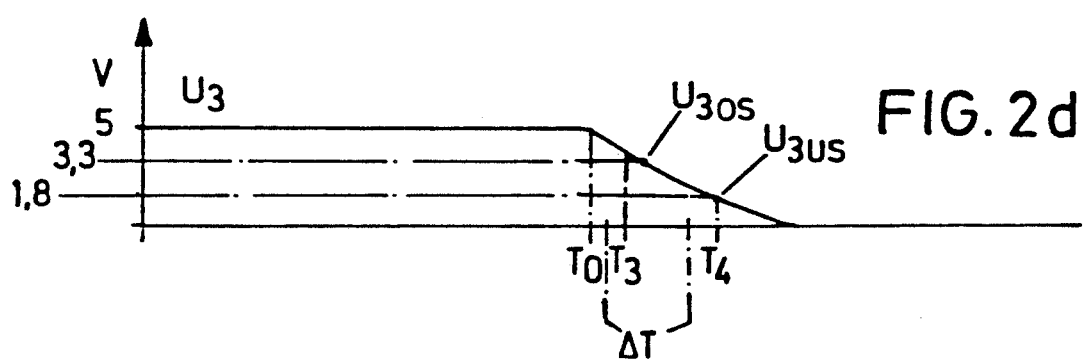

The voltage $U_3$ at the chip-select input CSA also drops beginning at the instant $T_0$ and at an instant $T_4$ dips below the lower threshold voltage $U_{3US}$ at the CSA input of the memory 11 (compare FIG. 2d).

It is now assured, by means of the circuit of the invention, that on the one hand the microcomputer 10 is still capable of operation in every case at the moment $T_4$ at which the input CSA of the semiconductor store 11 becomes blocked, which means that $U_2$ is greater than $U_{2min}$, so that in no case will data still be written into the semiconductor memory during an undefined operating condition of the microcomputer, while on the other hand the condition is fulfilled that up to the instant $T_3$ at which the microcomputer can first reconize the dropoff of the voltage $U_B$ and impede any new data transfer, a previously begun data transfer will still be brought to completion under proper operating conditions, which is to say that after the instant $T_3$ at least a time interval $\Delta T$, for example 150 microseconds, will remain available for such a complete data transfer before the voltage $U_3$ dips below its lower threshold value $U_{3US}$ at the instant $T_4$.

For completeness of description it should be mentioned that in the illustrated embodiment utilizing the type 68 HC11 microcomputer there is an external connection for the quartz crystal oscillator 17 for the timing circuits and another external connection 18 for the capacitor 19 and didode 20 for the reset circuit, both shown in FIG. 1. As already mentioned, the data inputs and the outputs controlled by data processing have been omitted in the drawing.

Although the invention has been described with reference to a particular illustrative example, it will be understood that variations and modifications are possible within the inventive concept.

We claim:

1. A supply voltage network for supplying a microcomputer (10) and at least one memory (11) with energizing voltage derived from a d-c source having a fluctuating output and subject to occasional disconnection from said network, said network also serving for assuring that any data statement, for which a transfer from said microcomputer to said at least one memory has actually begun before recognition by said microcomputer of said disconnection, will be completely written into said at least one memory before said at least one memory becomes disabled, said microcomputer including means for cyclical interrogation of a value representative of voltage received from said d-c source in order to recognize the appearance of said disconnection or of an equivalent battery failure, and said at least one memory having a write-in enabling input for enabling writing into said at least one memory only for a period after application of a voltage exceeding an upper threshold voltage until the applied voltage falls below a lower threshold voltage, said network comprising:

first means, including a first capacitor ($C_3$) for maintaining an enabling voltage ($U_3$) at said write-in enabling input (CSA) of said at least one memory which is not less than said lower threshold voltage for a first period ($T_4-T_0$) following said disconnection, said first period ($T_4-T_0$) being not less than the sum of a minimum interval ($\Delta T$) required for completing a transfer to said at least one memory of a data statement after initiation of said transfer and a maximum interval ($T_3-T_0$) required after said disconnection for said microcomputer to recognize said disconnection by fall-off of voltage ($U_B$) supplied by said d-c source prior to said disconnection;

second means, including a second capacitor ($C_2$), for maintaining operating voltage ($U_2$) of the operation in said microcomputer (10) necessary for said cyclical interrogation and for transfer of data to said at least one memory (11) at a value not less than a predetermined mimimum operating voltage ($U_{2min}$) therefore for a second period ending after, or at the same time as, said first period ($T_4-T_0$) for which said enabling voltage ($U_3$) at said write-in enabling input is maintained by said first means at a value not less than said lower threshold voltage, and third means, including at least a third capacitor ($C_4$) for maintaining operating voltage ($U_4$) for said at least one semiconductor memory (11) at a value not less than a predetermined minimum operating voltage therefore for a period ending after, or at the same time as, said first period ($T_4-T_0$) for which said enabling voltage is maintained by said first means at a value not less than said lower threshold voltage.

2. Network according to claim 1, wherein a voltage regulator, for said operating voltage ($U_2$) of at least the operation in said microcomputer necessary for said cyclical interrogation and for transfer of data to said at least one memory is interposed between said second capacitor ($C_2$) and said d-c source and wherein a fourth capacitor ($C_1$) is connected across the input of said voltage regulator (12) for prolonging the period after a said disconnection for which said voltage regulator produces a normal regulated output.

3. Network according to claim 1, wherein means including a second voltage source, independent of said d-c voltage source having a fluctuating output voltage, are provided for maintaining operating voltage ($U_4$) for said at least one memory (11) at a value not less than a predetermined minimum operating voltage therefore for a period ending after, or at the same time as said first period ($T_4-T_0$) for which said enabling voltage is maintained by said first means at a value not less than said lower threshold voltage.

* * * * *